(12) United States Patent
Bradley

(10) Patent No.: US 11,754,606 B1
(45) Date of Patent: Sep. 12, 2023

(54) SYSTEM AND METHOD FOR CONNECTING VECTOR NETWORK ANALYZER MODULES

(71) Applicant: ANRITSU COMPANY, Morgan Hill, CA (US)

(72) Inventor: Donald Anthony Bradley, Morgan Hill, CA (US)

(73) Assignee: Anritsu Company, Morgan Hill, CA (US)

( * ) Notice: Subject to any disclaimer, the term of this patent is extended or adjusted under 35 U.S.C. 154(b) by 0 days.

(21) Appl. No.: 16/914,036

(22) Filed: Jun. 26, 2020

Related U.S. Application Data

(60) Provisional application No. 62/866,752, filed on Jun. 26, 2019.

(51) Int. Cl.
*G01R 27/28* (2006.01)
*H04L 12/44* (2006.01)
*G01R 29/10* (2006.01)
*G01R 35/00* (2006.01)

(52) U.S. Cl.
CPC ............. *G01R 27/28* (2013.01); *G01R 29/10* (2013.01); *G01R 35/005* (2013.01); *H04L 12/44* (2013.01)

(58) Field of Classification Search
CPC ...... G01R 27/28; G01R 35/005; G01R 29/10; H04L 12/44
See application file for complete search history.

(56) References Cited

U.S. PATENT DOCUMENTS

| | | | |
|---|---|---|---|
| 5,801,525 A | 9/1998 | Oldfield |
| 5,812,039 A | 9/1998 | Oldfield |
| 5,909,192 A | 6/1999 | Finch |
| 5,977,779 A | 11/1999 | Bradley |
| 6,049,212 A | 4/2000 | Oldfield |
| 6,291,984 B1 | 9/2001 | Wong |
| 6,316,945 B1 | 11/2001 | Kapetanic |
| 6,331,769 B1 | 12/2001 | Wong |
| 6,496,353 B1 | 12/2002 | Chio |
| 6,504,449 B2 | 1/2003 | Constantine |
| 6,509,821 B2 | 1/2003 | Oldfield |
| 6,525,631 B1 | 2/2003 | Oldfield |
| 6,529,844 B1 | 3/2003 | Kapetanic |
| 6,548,999 B2 | 4/2003 | Wong |
| 6,650,123 B2 | 11/2003 | Martens |

(Continued)

OTHER PUBLICATIONS

Akmal, M. et al., "An Enhanced Modulated Waveform Measurement System for the Robust Characterization of Microwave Devices under Modulated Excitation", Proceedings of the 6th European Microwave Integrated Circuits Conference, Oct. 10-11, 2011, Manchester, UK, © 2011, pp. 180-183.

(Continued)

*Primary Examiner* — Akm Zakaria
(74) *Attorney, Agent, or Firm* — KILPATRICK TOWNSEND & STOCKTON, LLP

(57) ABSTRACT

Systems and methods for configuring and interconnecting VNA modules in daisy chains or via hubs are disclosed which overcome the constraints on the arrangement of the VNA modules in a system and the limitations on the flexibility and performance of the system present in the prior art. The VNA modules have ports which can be configured as input or output ports. In embodiments, configurable optical ports allow for long distance interconnection of VNA modules and hubs without loss of synchronization.

21 Claims, 15 Drawing Sheets

(56) References Cited

U.S. PATENT DOCUMENTS

| | | | |
|---|---|---|---|
| 6,665,628 B2 | 12/2003 | Martens | |
| 6,670,796 B2 | 12/2003 | Mori | |
| 6,680,679 B2 | 1/2004 | Stickle | |
| 6,700,366 B2 | 3/2004 | Truesdale | |
| 6,700,531 B2 | 3/2004 | Abou-Jaoude | |
| 6,714,898 B1 | 3/2004 | Kapetanic | |
| 6,766,262 B2 | 7/2004 | Martens | |
| 6,832,170 B2 | 12/2004 | Martens | |
| 6,839,030 B2 | 1/2005 | Noujeim | |
| 6,882,160 B2 | 4/2005 | Martens | |
| 6,888,342 B2 | 5/2005 | Bradley | |
| 6,894,581 B2 | 5/2005 | Noujeim | |
| 6,917,892 B2 | 7/2005 | Bradley | |
| 6,928,373 B2 | 8/2005 | Martens | |
| 6,943,563 B2 | 9/2005 | Martens | |
| 7,002,517 B2 | 2/2006 | Noujeim | |
| 7,011,529 B2 | 3/2006 | Oldfield | |
| 7,016,024 B2 | 3/2006 | Bridge | |
| 7,019,510 B1 | 3/2006 | Bradley | |
| 7,054,776 B2 | 5/2006 | Bradley | |
| 7,068,046 B2 | 6/2006 | Martens | |
| 7,068,049 B2 * | 6/2006 | Adamian | G01R 27/28 324/612 |
| 7,088,111 B2 | 8/2006 | Noujeim | |
| 7,108,527 B2 | 9/2006 | Oldfield | |
| 7,126,347 B1 | 10/2006 | Bradley | |
| 7,173,423 B2 | 2/2007 | Buchwald | |
| 7,185,103 B1 * | 2/2007 | Jain | H04L 43/026 709/234 |
| 7,284,141 B2 | 10/2007 | Stickle | |
| 7,304,469 B1 | 12/2007 | Bradley | |
| 7,307,493 B2 | 12/2007 | Feldman | |
| 7,509,107 B2 | 3/2009 | Bradley | |
| 7,511,577 B2 | 3/2009 | Bradley | |
| 7,521,939 B2 | 4/2009 | Bradley | |
| 7,545,151 B2 | 6/2009 | Martens | |
| 7,683,602 B2 | 3/2010 | Bradley | |
| 7,683,633 B2 | 3/2010 | Noujeim | |
| 7,705,582 B2 | 4/2010 | Noujeim | |
| 7,746,052 B2 | 6/2010 | Noujeim | |
| 7,764,141 B2 | 7/2010 | Noujeim | |
| 7,872,467 B2 | 1/2011 | Bradley | |
| 7,924,024 B2 | 4/2011 | Martens | |
| 7,957,462 B2 | 6/2011 | Aboujaoude | |
| 7,983,668 B2 | 7/2011 | Tiernan | |
| 8,027,390 B2 | 9/2011 | Noujeim | |
| 8,058,880 B2 | 11/2011 | Bradley | |
| 8,145,166 B2 | 3/2012 | Barber | |
| 8,156,167 B2 | 4/2012 | Bradley | |
| 8,159,208 B2 | 4/2012 | Brown | |
| 8,169,993 B2 | 5/2012 | Huang | |
| 8,185,078 B2 | 5/2012 | Martens | |
| 8,278,944 B1 | 10/2012 | Noujeim | |
| 8,294,469 B2 | 10/2012 | Bradley | |
| 8,305,115 B2 | 11/2012 | Bradley | |
| 8,306,134 B2 | 11/2012 | Martens | |
| 8,410,786 B1 | 4/2013 | Bradley | |
| 8,417,189 B2 | 4/2013 | Noujeim | |
| 8,457,187 B1 | 6/2013 | Aboujaoude | |
| 8,493,111 B1 | 7/2013 | Bradley | |
| 8,498,582 B1 | 7/2013 | Bradley | |
| 8,538,350 B2 | 9/2013 | Varjonen | |
| 8,593,158 B1 | 11/2013 | Bradley | |
| 8,629,671 B1 | 1/2014 | Bradley | |
| 8,630,591 B1 | 1/2014 | Martens | |
| 8,666,322 B1 | 3/2014 | Bradley | |
| 8,718,586 B2 | 5/2014 | Martens | |
| 8,760,148 B1 | 6/2014 | Bradley | |
| 8,816,672 B1 | 8/2014 | Bradley | |
| 8,816,673 B1 | 8/2014 | Barber | |
| 8,884,664 B1 | 11/2014 | Bradley | |
| 8,903,149 B1 | 12/2014 | Noujeim | |
| 8,903,324 B1 | 12/2014 | Bradley | |
| 8,942,109 B2 | 1/2015 | Dorenbosch | |
| 9,103,856 B2 | 8/2015 | Brown | |
| 9,103,873 B1 | 8/2015 | Martens | |
| 9,153,890 B2 | 10/2015 | Warwick | |
| 9,176,174 B1 | 11/2015 | Bradley | |
| 9,176,180 B1 | 11/2015 | Bradley | |
| 9,210,598 B1 | 12/2015 | Bradley | |
| 9,239,371 B1 | 1/2016 | Bradley | |
| 9,287,604 B1 | 3/2016 | Noujeim | |
| 9,331,633 B1 | 5/2016 | Robertson | |
| 9,337,941 B2 | 5/2016 | Emerson | |
| 9,366,707 B1 | 6/2016 | Bradley | |
| 9,455,792 B1 | 9/2016 | Truesdale | |
| 9,560,537 B1 | 1/2017 | Lundquist | |
| 9,571,142 B2 | 2/2017 | Huang | |
| 9,588,212 B1 | 3/2017 | Bradley | |
| 9,594,370 B1 | 3/2017 | Bradley | |
| 9,606,212 B1 | 3/2017 | Martens | |
| 9,680,245 B2 | 6/2017 | Warwick | |
| 9,685,717 B2 | 6/2017 | Warwick | |
| 9,696,403 B1 | 7/2017 | Elder-Groebe | |
| 9,733,289 B1 | 8/2017 | Bradley | |
| 9,753,071 B1 | 9/2017 | Martens | |
| 9,768,892 B1 | 9/2017 | Bradley | |
| 9,860,054 B1 | 1/2018 | Bradley | |
| 9,964,585 B1 | 5/2018 | Bradley | |
| 9,967,085 B1 | 5/2018 | Bradley | |
| 9,977,068 B1 | 5/2018 | Bradley | |
| 10,003,453 B1 | 6/2018 | Bradley | |
| 10,006,952 B1 | 6/2018 | Bradley | |
| 10,064,317 B1 | 8/2018 | Bradley | |
| 10,116,432 B1 | 10/2018 | Bradley | |
| 10,158,433 B2 * | 12/2018 | Lloyd | H01Q 3/24 |
| 2005/0258815 A1 * | 11/2005 | Shoulders | G01R 27/28 324/76.23 |
| 2014/0327429 A1 * | 11/2014 | Ziomek | G01R 27/28 324/96 |
| 2020/0103485 A1 * | 4/2020 | Anderson | G01R 35/00 |

OTHER PUBLICATIONS

Cunha, Telmo R. et al., "Characterizing Power Amplifier Static AM/PM with Spectrum Analyzer Measurements", IEEE © 2014, 4 pages.

Fager, Christian et al., "Prediction of Smart Antenna Transmitter Characteristics Using a New Behavioral Modeling Approach" IEEE ® 2014, 4 pages.

Fager, Christian et al., "Analysis of Nonlinear Distortion in Phased Array Transmitters" 2017 International Workshop on Integrated Nonlinear Microwave and Millmetre-Wave Circuits (INMMiC), Apr. 20-21, 2017, Graz, Austria, 4 pages.

Martens, J. et al., "Towards Faster, Swept, Time-Coherent Transient Network Analyzer Measurements" 86th ARFTG Conf. Dig., Dec. 2015, 4 pages.

Martens, J., "Match correction and linearity effects on wide-bandwidth modulated AM-AM and AM-PM measurements" 2016 EuMW Conf. Dig., Oct. 2016, 4 pages.

Nopchinda, Dhecha et al., "Emulation of Array Coupling Influence on RF Power Amplifiers in a Measurement Setup", IEEE © 2016, 4 pages.

Pedro, Jose Carlos et al., "On the Use of Multitone Techniques for Assessing RF Components' Intermodulation Distortion", IEEE Transactions on Microwave Theory and Techniques, vol. 47, No. 12, Dec. 1999, pp. 2393-2402.

Ribeiro, Diogo C. et al., "D-Parameters: A Novel Framework for Characterization and Behavorial Modeling of Mixed-Signal Systems", IEEE Transactions on Microwave Theory and Techniques, vol. 63, No. 10, Oct. 2015, pp. 3277-3287.

Roblin, Patrick, "Nonlinear RF Circuits and Nonlinear Vector Network Analyzers; Interactive Measurement and Design Techniques", The Cambridge RF and Microwave Engineering Series, Cambridge University Press © 2011, entire book.

Rusek, Fredrik et al., "Scaling Up MIMO; Opportunities and challenges with very large arrays", IEEE Signal Processing Magazine, Jan. 2013, pp. 40-60.

Senic, Damir et al., "Estimating and Reducing Uncertainty in Reverberation-Chamber Characterization at Millimeter-Wave Fre-

(56) References Cited

OTHER PUBLICATIONS quencies", IEEE Transactions on Antennas and Propagation, vol. 64, No. 7, Jul. 2016, pp. 3130-3140.
Senic, Damir et al., "Radiated Power Based on Wave Parameters at Millimeter-wave Frequencies for Integrated Wireless Devices", IEEE © 2016, 4 pages.

* cited by examiner

FIG. 4B
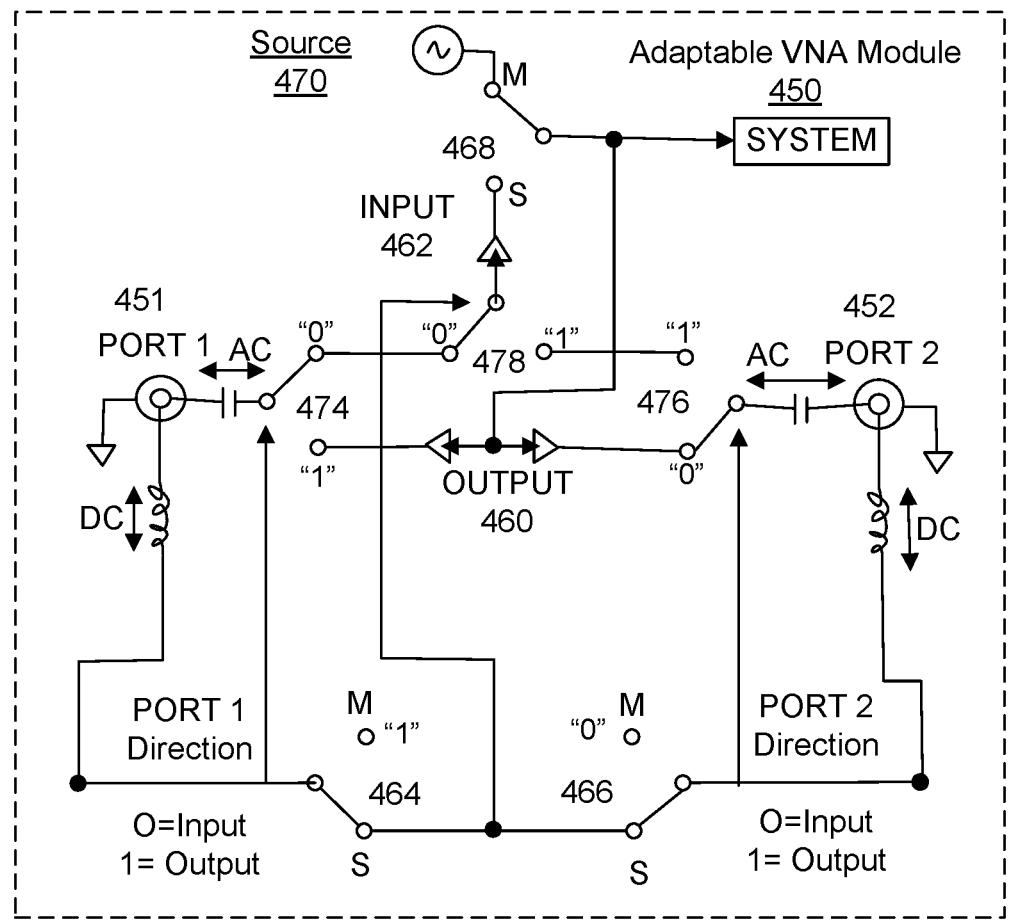
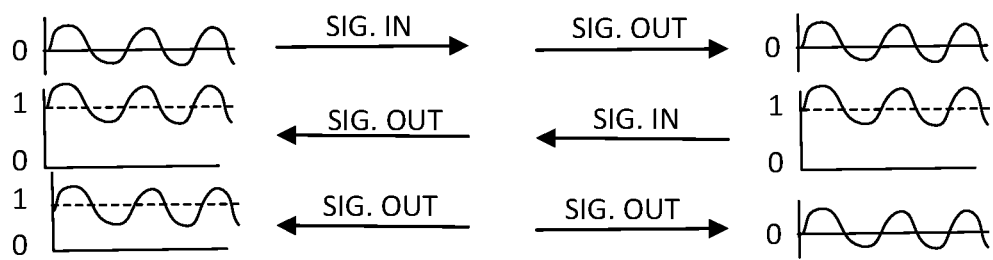
FIG. 4C

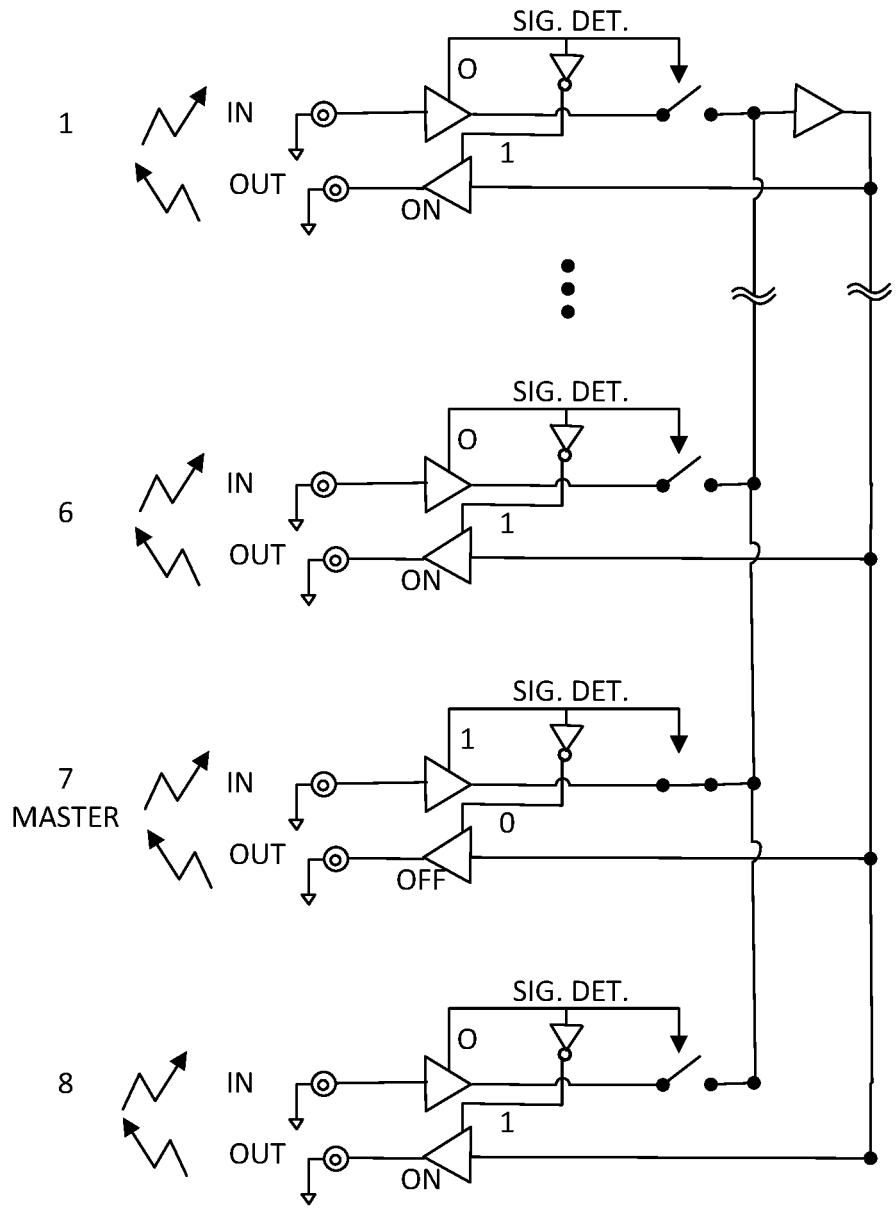

SYSTEM AND METHOD FOR CONNECTING VECTOR NETWORK ANALYZER MODULES

CLAIM OF PRIORITY

This application claims the benefit of priority to U.S. Provisional Application No. 62/866,752 filed Jun. 26, 2019 titled "SYSTEM AND METHOD FOR CONNECTING VECTOR NETWORK ANALYZER MODULES", which application is hereinafter incorporated by reference in its entirety.

TECHNICAL FIELD

The present invention relates generally to vector network analyzers and more particularly, the present invention relates to systems and methods for connecting vector network analyzer modules.

BACKGROUND

A vector network analyzer (VNA) is a reflectometer-based electronic instrument that can be used to measure the frequency response (magnitude and phase) of a device under test (DUT) such as an electrical network, component, circuit, or sub-assembly. A VNA makes use of a frequency sweeping source or stimulus, directional couplers, and one or more receivers that provide ratioed amplitude and phase information such as reflection and transmission coefficients. In embodiments, a VNA system can utilize multiple VNA modules. It is desirable in a VNA system utilizing multiple VNA modules, that the VNA modules are synchronized with the same frequency sweeping source. Accordingly, a source in single master VNA module is used to generate the frequency sweeping signal and this signal is passed through connections/ports to one or more slave VNA modules which monitor the source signal generated in the master VNA module. The connection of master to slave can be by means of daisy chaining the VNA modules or by use of a hub.

Conventionally, VNA modules have dedicated input and output ports for receiving and transmitting the frequency sweeping signal. The dedicated input and output ports must be hard wired together in a particular topology. However, the use of dedicated inputs and output ports and the need for wiring the ports in a particular topology places constraint on the arrangement of the VNA modules in a system and limitations on the flexibility and performance of the system.

Accordingly, it would be desirable to provide enhanced VNA modules and hubs which overcome the constraints on the arrangement of the VNA modules in a system and the limitations on the flexibility and performance of the system present in the prior art.

SUMMARY OF THE INVENTION

The present disclosure describes enhanced VNA modules and hubs which overcome the constraints on the arrangement of the VNA modules in a system and the limitations on the flexibility and performance of the system present in the prior art.

In embodiments, VNA modules and hubs are provided with configurable ports. The ports may be configured for use as inputs or outputs or as bidirectional ports.

In embodiments, systems and methods for configuring and interconnecting VNA modules in daisy chains or via hubs are disclosed which overcome the constraints on the arrangement of the VNA modules in a system and the limitations on the flexibility and performance of the system present in the prior art. The VNA modules have ports which can be configured as input or output ports.

In embodiments, configurable optical ports allow for long distance interconnection of VNA modules and hubs without loss of synchronization.

Further objects and advantages of the present invention will become apparent to those skilled in the art from the following detailed description of the various embodiments, when read in light of the accompanying drawings.

BRIEF DESCRIPTION OF THE DRAWINGS

FIGS. 4A-4C illustrate aspects of an adaptable VNA module according to an embodiment of the invention.

FIG. 9 illustrates a block diagram of an adaptable long range star hub having optical ports according to an embodiment.

DETAILED DESCRIPTION

Figure 1A:
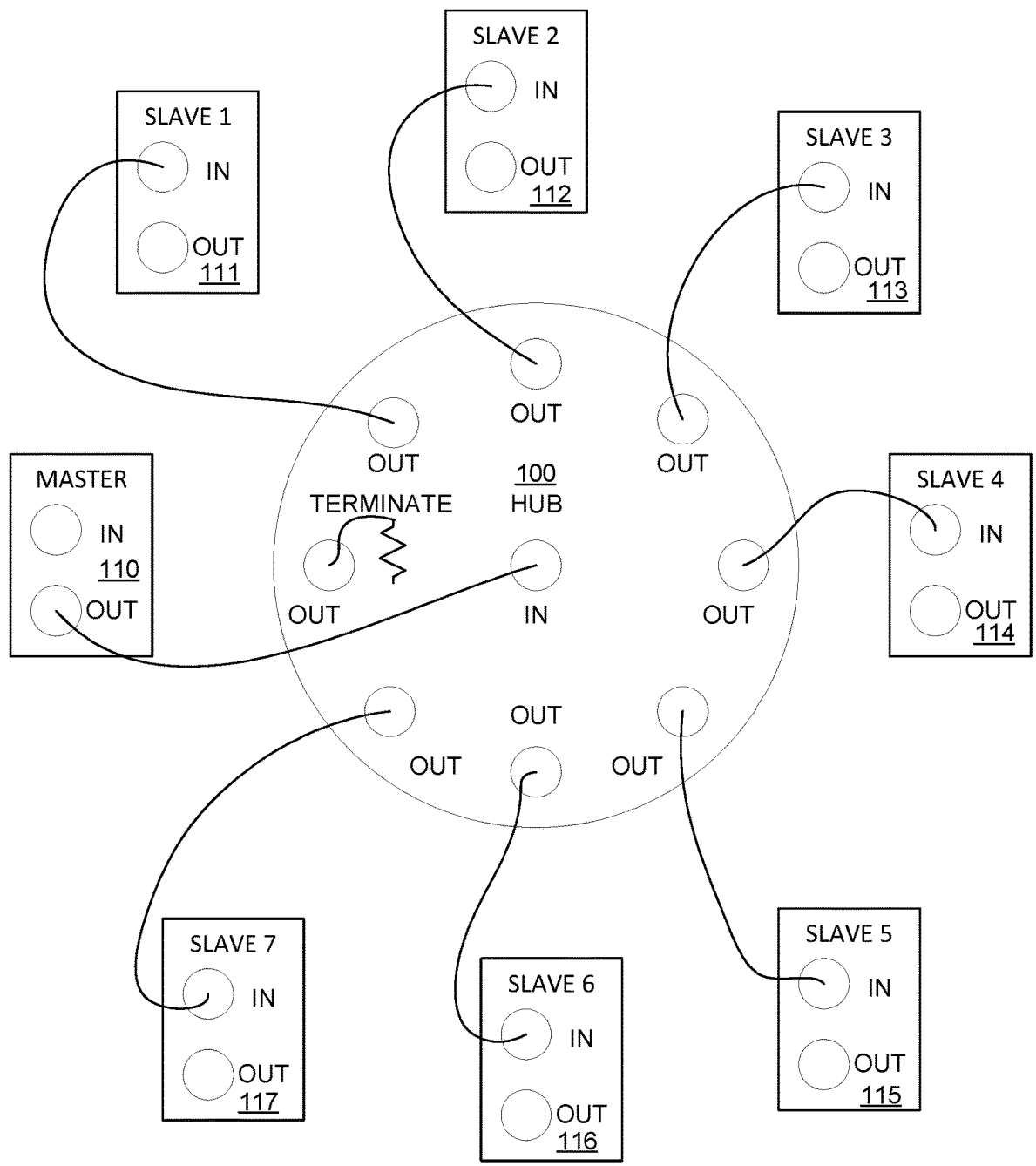
FIG. 1A is an illustration of a prior art hub for connecting VNA modules.

The following description is of the best modes presently contemplated for practicing various embodiments of the present invention. The description is not to be taken in a limiting sense but is made merely for the purpose of describing the general principles of the invention. The scope of the invention should be ascertained with reference to the claims. In the description of the invention that follows, like numerals or reference designators will be used to refer to like parts or elements throughout.

In the following description, numerous specific details are set forth to provide a thorough description of the invention. However, it will be apparent to those skilled in the art that the invention may be practiced without these specific details. In other instances, well-known features have not been described in detail so as not to obscure the invention.

A vector network analyzer (VNA) is a reflectometer-based electronic instrument that can be used to measure the frequency response (magnitude and phase) of a device under test (DUT) such as an electrical network, component, circuit, or sub-assembly. A VNA makes use of a frequency sweeping source or stimulus, directional couplers, and one or more receivers that provide ratioed amplitude and phase information such as reflection and transmission coefficients. In embodiments, a VNA system can utilize multiple VNA modules the modules can be mounted in a single rack or the modules can be located at a distance from each other. Each module comprises one or more test port for connecting the module to a device under test (DUT). For example each module may have one test port and an eight test port VNA system can be created by combining eight of such modules.

It is desirable in a VNA system utilizing multiple VNA modules, that the VNA modules are synchronized with the same frequency sweeping source. Accordingly, a source in single master VNA module is used to generate the frequency sweeping signal and this signal is passed through connections/ports to one or more slave VNA modules which monitor the source signal generated in the master VNA module. The connection of master to slave can be by means of daisy chaining the VNA modules or by use of a hub. In embodiments of the present invention the adaptable VNA modules and adaptable star hubs are provided which have configurable ports for receiving transmitting RF signal to/from other VNA modules or the hub. These ports are configurable such that they can server as either input or output ports. The configurability of the ports allows form improved configurability of the multi-module system without the need for manual rewiring of connections between modules.

Adaptable Star Hub

A hub module can be used to connect a master VNA module to multiple slave VNA modules. A source in a single master VNA module is used to generate the frequency sweeping signal and this signal is passed through the hub to one or more slave VNA modules. Prior hub techniques rely on the left end unit being the Master and all units to its right being Slaves. Connectors and cables between master, hub and slave VNA modules dictate the physical setup. This is simple and efficient but lacks flexibility of placement and connection of modules.

FIG. 1A is an illustration of a prior art hub 100 for connecting VNA modules. As shown in FIG. 1A, the output port of the master VNA module 110 is hardwired to a dedicated input port of the hub 100. The hub 100 has eight dedicated output ports. Each output port is hardwired to the input port of a slave VNA module 111, 112, 113, 114, 115, 116, 117. In use, the Master VNA module provides a source signal to the hub through the dedicated input port. The source signal is then provided via each of the dedicated output ports to the input port of each of the slave VNA modules. Any unused output ports are properly terminated. A disadvantage of this system is that, in order to use a different VNA module as the master VNA module, the wired connections must be manually changed.

Figure 1B:
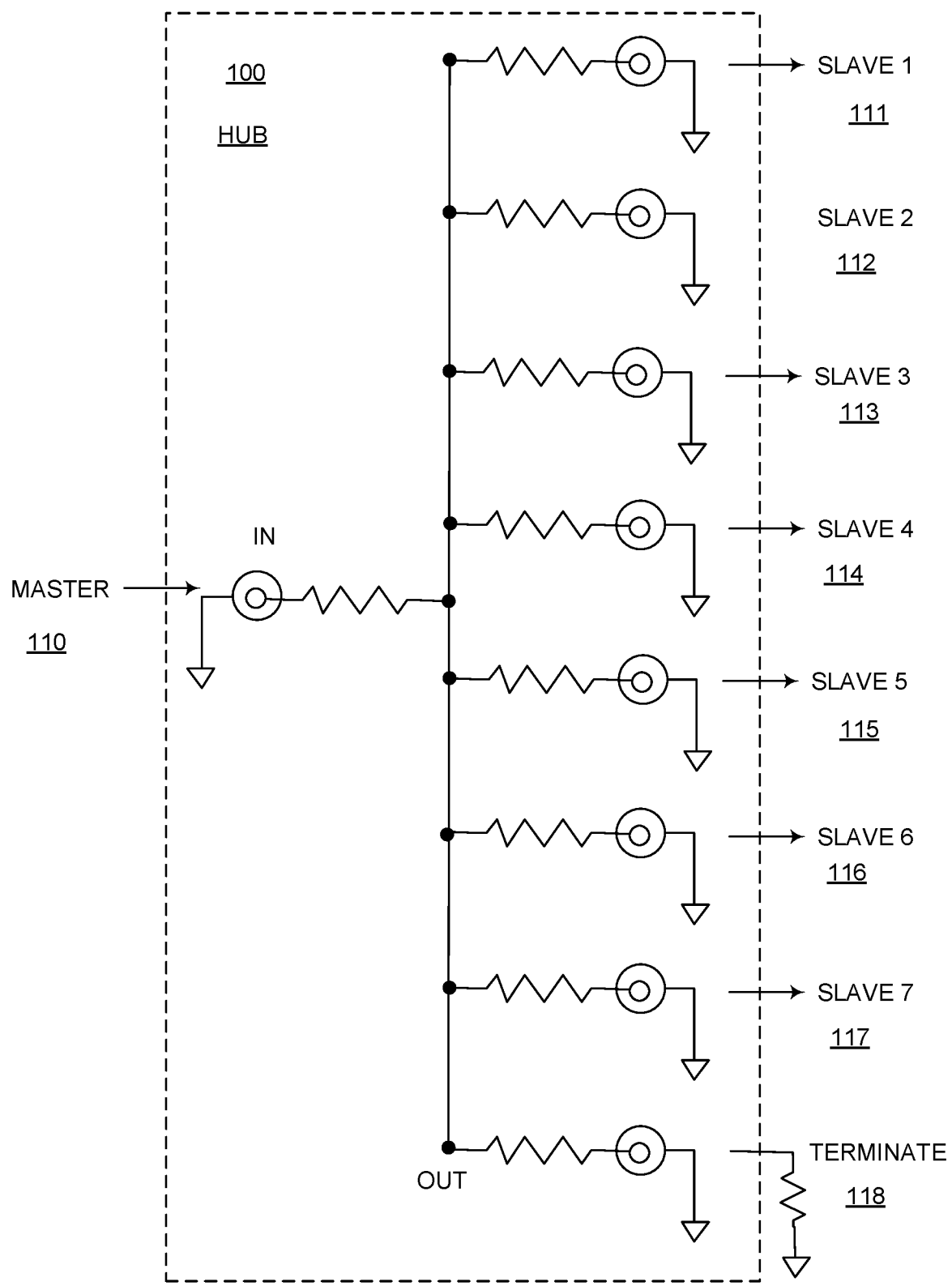
FIG. 1B is a partial circuit diagram of a prior art hub for connecting VNA modules.

FIG. 1B is a partial circuit diagram of the prior art hub 100 for connecting VNA modules. As shown in FIG. 1B, the output port of the master VNA module 110 is hardwired to a dedicated input port of the hub 100. The circuitry of the hub does not allow the input port to be used as an output port. The hub has eight dedicated output ports. The circuitry of the hub does not allow the output ports to be used as input ports. Each output port is hardwired to the input port of a slave VNA module. In use, the Master VNA module 100 provides a source signal to the hub 100 through the dedicated input port. The source signal is then provided via each of the dedicated output ports to the input port of the slave VNA modules 111, 112, 113, 114, 115, 116, 117. Any unused output ports are properly terminated 118. Reconfiguring the VNAs requires manual reconnection of the wires connecting the VNA modules and the hub 100.

As shown in FIGS. 1A and 1B the VNA modules and hub are not configurable. The input port of the hub may only be connected to the output port of a master VNA module. The output ports of the hub may only be connected to input ports of slave VNA modules or properly terminated. The use of dedicated inputs and output ports and the need for wiring the ports in a particular topology places constraint on the arrangement of the VNA modules and hub in a system and places limitations on the flexibility and performance of the system.

Figure 2A:
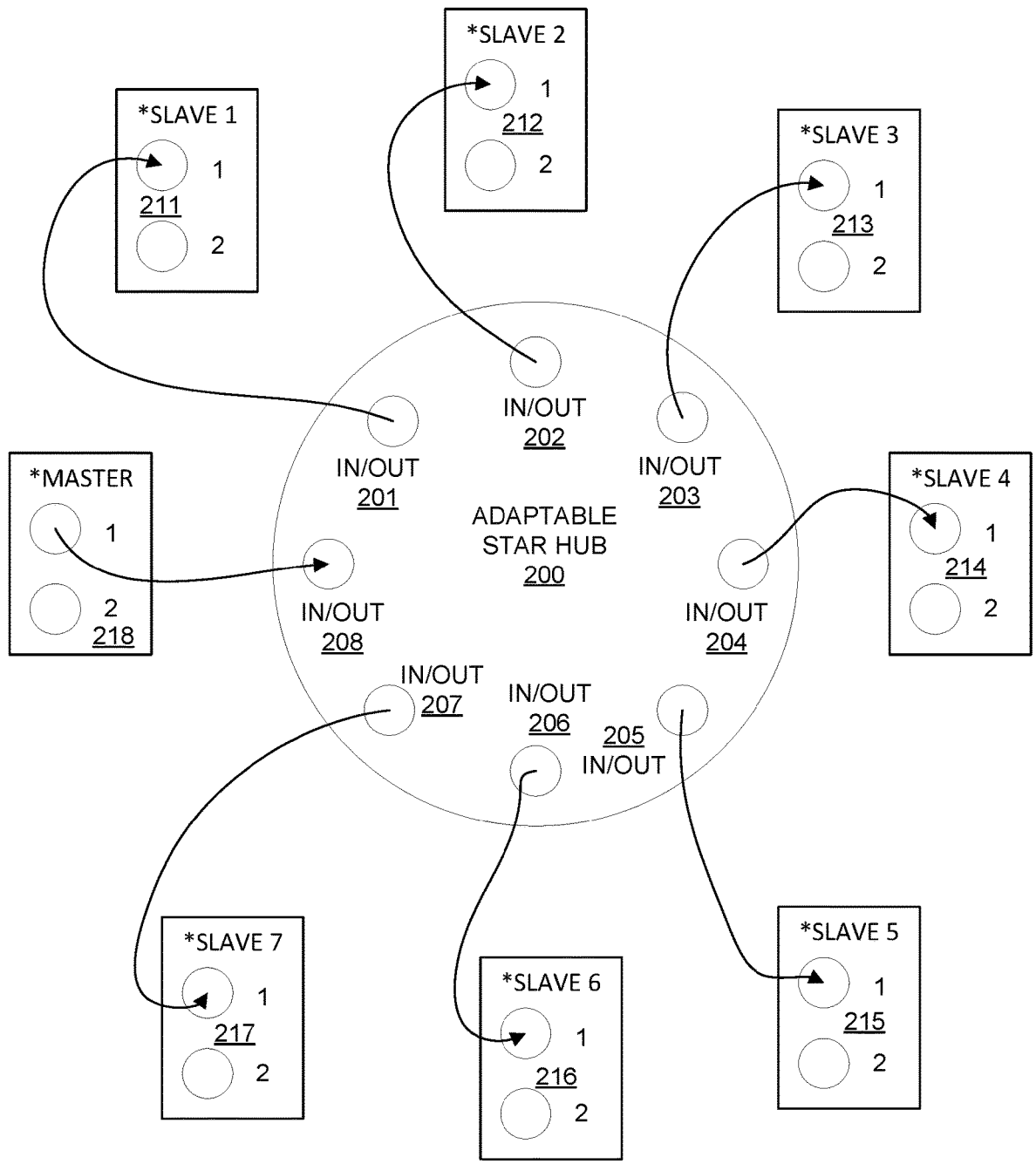
FIG. 2A is an illustration of an adaptable star hub for connecting VNA modules according to an embodiment of the invention.

FIG. 2A is an illustration of an adaptable star hub 200 for connecting VNA modules according to an embodiment of the invention. The adaptable star hub overcomes the limitations of prior systems by breaking the dedicated hardware relationship between the Master, Hub and the Slaves by making all Star Hub ports bidirectional (Signal pass upstream or Downstream). One advantage of the approach allows any unit to be a Master, providing the VNA modules are also adaptable as well. Any VNA can be a Master. No re-cabling needed for reconfiguring Master selection. In a preferred embodiment, the adaptable star hub is used in conjunction with a VNA which also has one or more ports which is configurable as an input or an output port. FIG. 2A shows two ports (labeled 1 and 2) on each VNA module. An embodiment of an adaptable VNA module is shown for example in FIGS. 4A-4C. Each of the ports can be configured for input or output. An alternative embodiment is a USB one port VNA with an Adaptable Master Slave option—such that the VNA and its single port can be configured (over the USB interface) as either a master/output or slave/input respectively.

As shown in FIG. 2A, the adaptable star hub 200 is provided with eight configurable in/out ports 201-208. Depending upon the configuration of the adaptable star hub 200, any one of the eight configurable in/out ports is configured as an input port while the remaining seven configurable in/out ports are configured as output ports.

As shown in FIG. 2A, IN/OUT port 208 is configured as an input port whereas in/out ports 201-207 are configured as output ports. Each of ports 201-207 is connected to the port 1 of VNA modules 211-217 which ports are configured as input ports. Port 208 is connected to port 1 of VNA module 218 which is configured as an output port. In this configuration, VNA module 208 serves as the master module which provides a source signal from port 1 to port 208 of adaptable star hub 200. Port 1 of VNA module 218 is configured as an output port.

The adaptable star hub 200 distributes the source signal via each of ports 201-207 to the port 1 of each VNA module 211-217. VNA modules 211-217 function as slave VNA modules in this configuration. However, depending upon the configuration of the VNA modules 201-208 and adaptable star hub 200, any one of the VNA modules might serve as the master VNA module without necessitating a change in the physical wiring between the VNA modules and the hub. For example VNA module 211 could be configured as a master with a port 1 of VNA module 211 configured as an output. At the same time VNA module 218 could be configured as a slave with a port 1 of VNA module 218 configured as an input. At the same time, in/out port 208 is configured as an output and in/out port 201 is configured as an input to adaptable star hub 200. This would change the master slave relationship of the VNA modules without requiring manual re-cabling of the system.

Figure 2B:
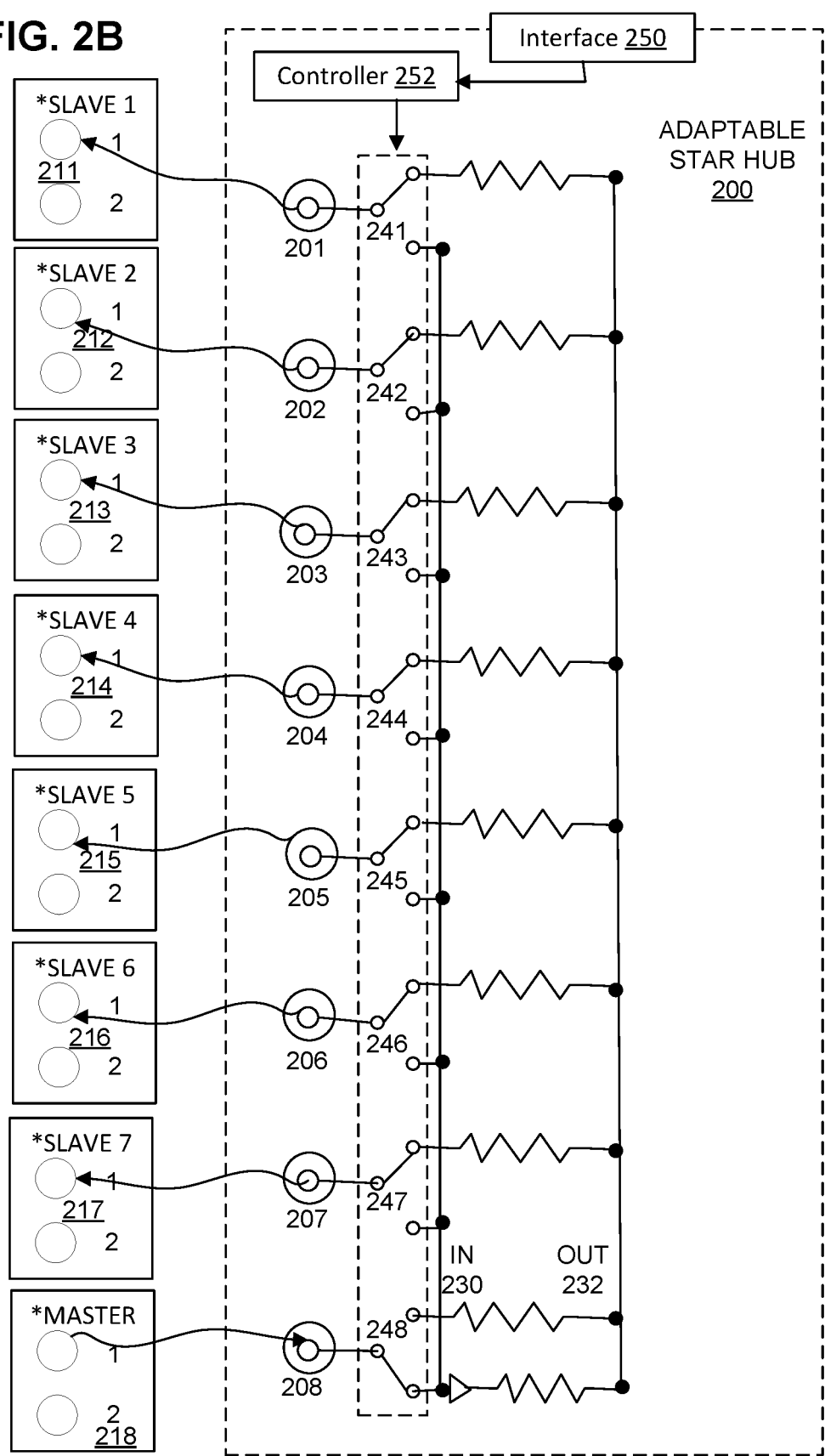
FIG. 2B is a partial circuit diagram of the adaptable star hub for connecting VNA modules of FIG. 2A according to an embodiment of the invention.

FIG. 2B is a partial circuit diagram of the adaptable star hub for connecting VNA modules of FIG. 2A according to an embodiment of the invention. As shown in FIG. 2B, the adaptable star hub 200 is provided with eight configurable in/out ports 201-208. Depending upon the configuration of the adaptable star hub 200, any one of the eight configurable in/out ports is configured as an input port while the remaining seven configurable in/out ports are configured as output ports (or properly terminated if not in use). As shown in FIG. 2B, adaptable star hub 200 includes an input line/bus 230 and output line/bus 232. Adaptable star hub includes configurable switches 241-248 associated with each of the eight configurable in/out ports 201-208. The switches can selectively connect each of the ports to either the input line 230 or output line 232. As shown in FIG. 2B, port 208 is connected by switch 248 to input line 230 making port 208 an input port, whereas ports 201-207 are connected by switches 241-247 to output line 232 making them output ports.

Each of adaptable star hub ports 201-207 is connected to the port 1 of VNA modules 211-217 which VNA ports are configured as input ports. Port 208 is connected to port 1 of VNA module 218 which is configured as an output port. In this configuration, VNA module 208 serves as the master module which provides a source signal from port 1 to port 208 of adaptable star hub 200.

The adaptable star hub 200 distributes the source signal received from master VNA 218 through in/out port 208 via each of ports 201-207 to the port 1 (input) of each slave VNA module 211-217. VNA modules 211-217 function as slave VNA modules in this configuration. However, depending upon the configuration of the VNA modules 201-208 and switches 241 to 248 of adaptable star hub 200, any one of the VNA modules might serve as the master VNA module without necessitating a change in the physical wiring between the VNA modules and the hub.

Switches 241-247 can be implemented in a variety of technologies. For example, switches 241-247 can be implemented as mechanical switches (dip switches or buttons) which can be operated by the user. Alternatively, switches 241-248 can be implemented using programmable logic devices such as controller 252. The programmable logic devices may be configured by an interface 250 on the adaptable star hub or over a network connection to the adaptable star hub. In some embodiments, signals for configuring the switches implemented in programmable logic device are transmitted over one or more of the in/out ports 211-217, over a separate USB connection to the adaptable star hub, or over a network connection to the adaptable star hub 200. Switch configuration can be non-transitory such that the switches retain their configuration until they are reconfigured by user action (even if the device is power cycled). In an embodiment, USB connections to each of the VNA modules and the star hub are provided such that port configurations of the VNA modules and the star hub can be controlled by a computer connected to each of VNA modules and the star hub by USB cables. In an alternative embodiment, network/ethernet connections to each of the VNA modules and the star hub are provided such that port configurations of the VNA modules and the star hub can be controlled by a computer connected to each of VNA modules and the star hub by network cables.

Adaptable VNA Module

A master VNA module can be connected to multiple slave VNA modules by connecting the VNA modules in a daisy chain arrangement without a hub. A source in the single master VNA module is used to generate the frequency sweeping RF signal and this signal is passed from the master VNA module to one or more slave VNA modules. Prior techniques relied on the left end unit being the Master and all units to its right being Slaves. Connectors and cables between Master and Slave units dictate the physical setup. This is simple and efficient but lacks flexibility of placement and connection of modules.

Figure 3:
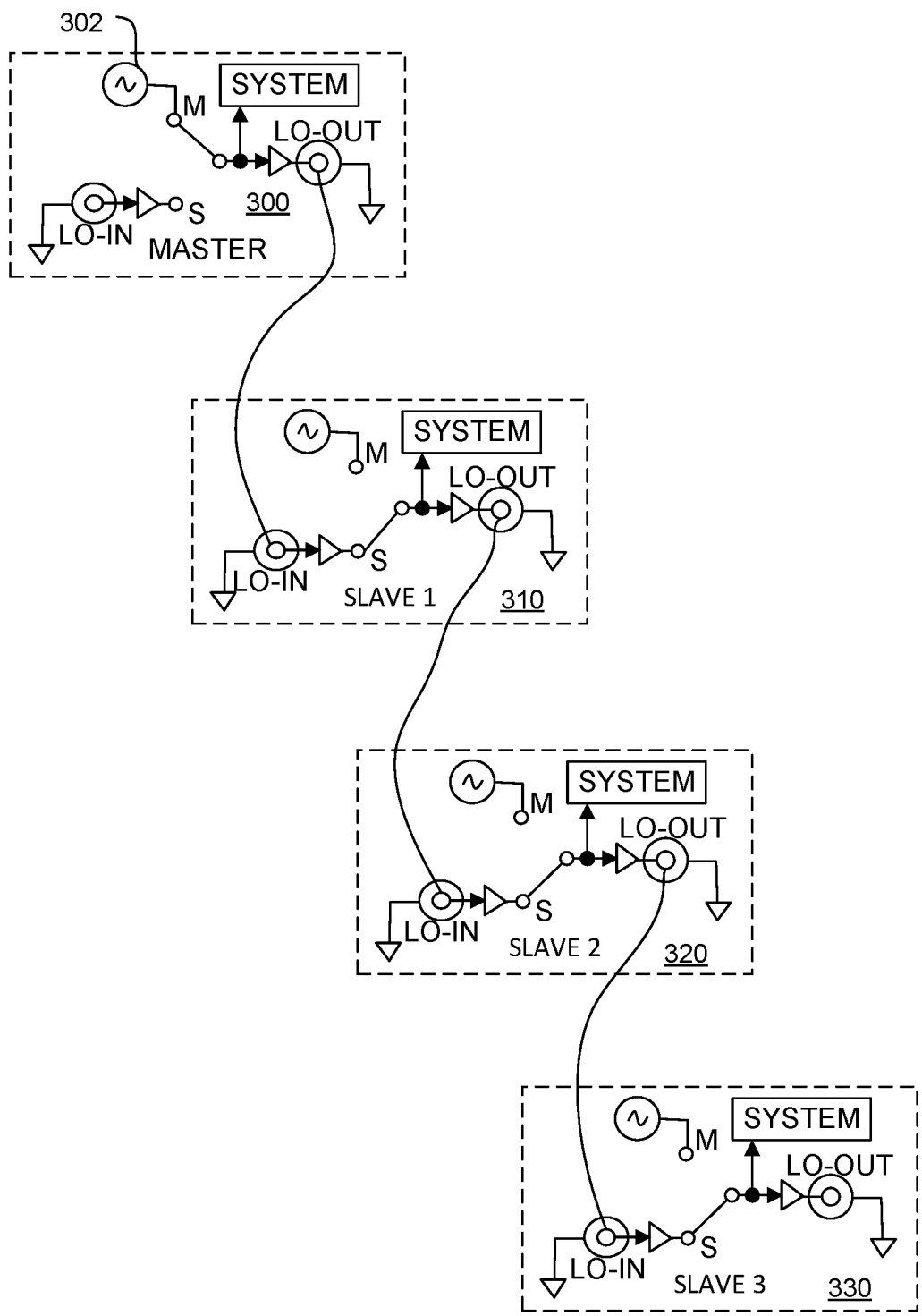
FIG. 3 illustrates a daisy chain arrangement of conventional VNA modules.

FIG. 3 illustrates a prior art daisy chain arrangement of conventional VNA modules. As shown in FIG. 3, each VNA module has a dedicated input port and a dedicated output port. The master VNA module 300 is hardwired at position 1 in the chain. The master VNA module generates an RF signal with source 302. The LO output of the master VNA module 300 is wired to input of the first slave VNA module 310. The output of the first slave VNA module 310 is wired to input of the second slave VNA module 320. The output of the second slave VNA module 320 is wired to input of the third slave VNA module 330. Additional slave modules can be connected in similar fashion. The RF signal generated by the master VNA module is passed via LO-OUT of the module to the other VNA modules in the daisy chain. However, phase stability in the RF signal passed along the chain is impaired as more modules are added to the chain due to cumulative drift in line amplifiers in the signal path along the daisy chain of VNA modules.

Figure 4A:
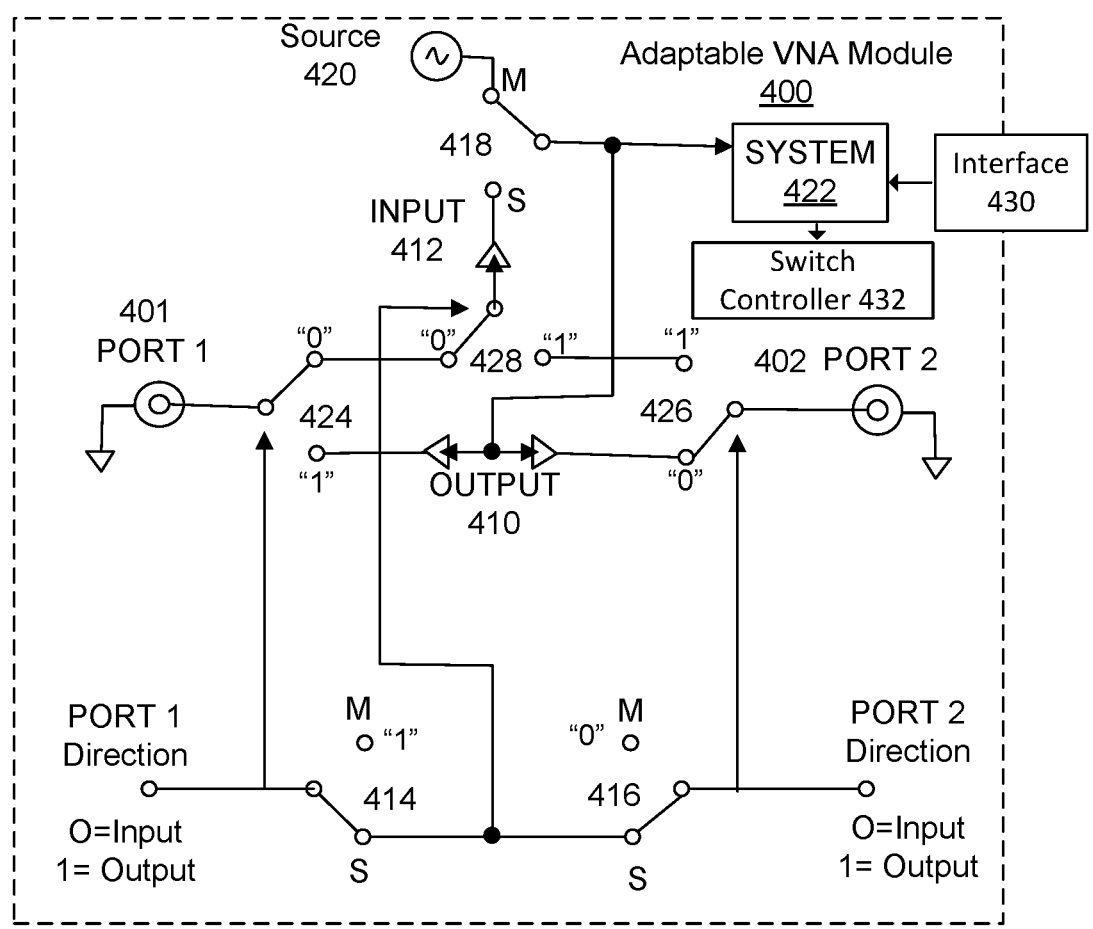

FIGS. 4A-4C illustrate embodiments of an adaptable VNA module according to an embodiment of the invention. As shown in FIG. 4A, adaptable VNA module 400 has two configurable ports, Port 1 401 and Port 2 402. Adaptable VNA module 400 may be configured as a master VNA module by connecting source 420 to output line 410. When configured as a master, each of switches 414, 416, 418 is set to the M position. Switch 418 connects source 420 to system 422 as well as connecting source 420 to output line 410. Each port may be configured as either an input or an output. Switches 424, 426, 428 determine whether each of Port 1 and Port 2 is connected to input 412 or output 410. The VNA modules each also have one or more test ports (not shown) for connecting the VNA to a device under test (DUT). For sake of clarity only the ports for distributing the RF signal and synchronizing the VNA modules are shown in the drawings.

When an adaptable VNA module is configured as a master, one or both of Ports 1 and 2 are configured as output ports—no input is required because the internal RF source 420 of the master VNA is used. When an adaptable VNA module is configured as a slave, one of Ports 1 and 2 is configured as an input port and the other is configured as an output port—a source signal is received on the configured input port—provided to the VNA system and also provided to the configured output port for transmission to another module—the internal source 420 is not used. PORT 1 Direction and Port 2 Direction inputs control the configuration of switches 424, 426, and 428 and thus determine which or Port 1 and 2 is used as an input (slave configuration only) or output port. In an embodiment input signals to control switches 424, 426, and 428 are provided by separate control lines to the adaptable VNA module. Such input signals could alternatively be provided, by programmable logic, a USB interface, network interface, or signal carried on the input/output port itself. For example an interface 430 allows system 422 to communicate with a host computer not shown. In an embodiment, the host computer can cause the system 422 to operate switch controller 432 to configure the switches for appropriate configuration as master or slave.

FIGS. 4B and 4C, illustrate an alternative embodiment of the adaptable VNA module. As shown in FIG. 4B, adaptable VNA module 450 is similar to adaptable VNA module 400 of FIG. 4A. As shown in FIG. 4B, adaptable VNA module 450 has two configurable ports, Port 1 451 and Port 2 452. Adaptable VNA module 450 may be configured as a master VNA module by connecting source 470 to output line 460. When configured as a Master, each of switches 464, 466, 468 is set to the M position. Switch 468 connects source 470 to system 472 as well as connecting source 470 to output line 460.

Each port may be configured as either an input or an output. Switches 474, 476, 478 determine whether each of Port 1 and Port 2 is connected to input 462 or output 460. When adaptable VNA module is configured as a master, one or both of Ports 1 and 2 are configured as output ports—no input is required because the internal source 470 is used. When adaptable VNA module is configured as a slave, one of Ports 1 and 2 is configured as an input port and the other is configured as an output port—a source signal is received on the configured input port— provided to the VNA system and also provided to the configured output port for transmission to another module—the internal source 470 is not used. PORT 1 Direction and Port 2 Direct inputs control the configuration of switches 474, 476, and 478 and thus determine which or Port 1 and 2 is used as an input (slave configuration only) or output port.

In an embodiment input signals to control switches 474, 476, and 478 are provided on the same line as are connected to Port 1, and Port 2. An AC component of the signal 9 The RF signal form the source of the master module) passes form Port 1 to switch 451 and from Port 2 to switch 476. However, a DC component (DC offset) is transmitted from each port to the Port 1 and Port 2 direction control lines. This DC offset is detected and used to configure the port as either an output port or an input port. This embodiment avoids the need for additional control lines/interfaces to control the configuration of the input/output ports. FIG. 4C shows examples of the signals and signal offset voltages that can be used to control the Port 1 and Port 2 direction logic. In an embodiment, the presence of a DV offset indicate a 1 value and the absence of the DC offset indicate the zero value. Based on the DC offset value, the VNA module configures each of the switches as either an input or output as shown in FIG. 2B.

The adaptable VNA module provides several benefits for interconnecting VNA modules. Any VNA can be a master or a slave. No re-cabling is required for master selection. Bidirectional daisy chain connections can be configured using both ports of a master VNA as outputs. Dual output ports enable a master-in-the middle configuration. The signal can pass upstream or downstream through a VNA module. This reduces the number of daisy chained modules (approximately half) through which the RF signal so pass from the master to the plurality of slaves in a daisy chain. This therefore improves phase stability of the system as a whole as compared to a longer single direction daisy chain such as shown in FIG. 3.

Figure 5A:
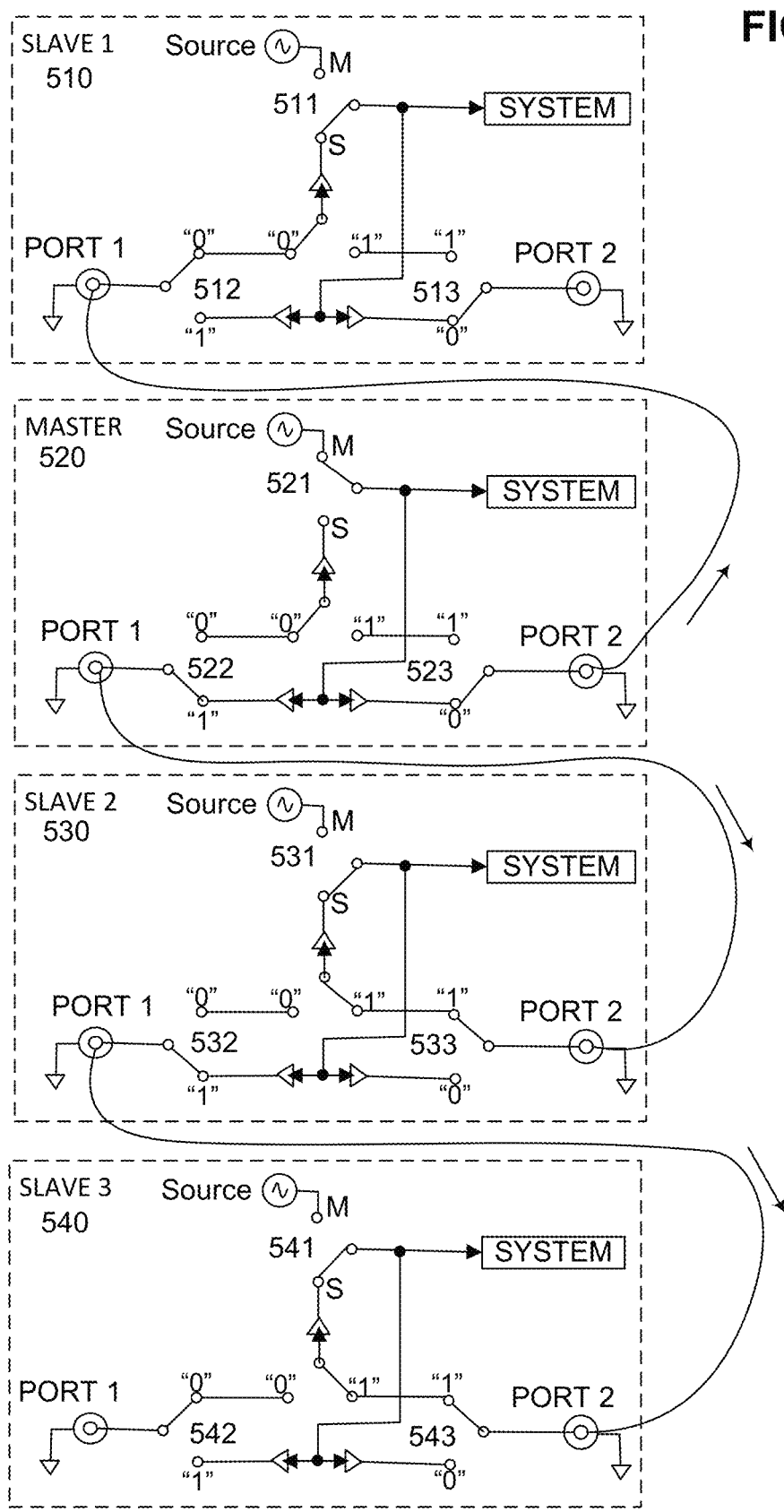
FIGS. 5A and 5B illustrates flexible connection of multiple adaptable VNA modules according to an embodiment of the invention.

FIG. 5A illustrates multiple flexible connection adaptable VNA modules according to an embodiment of the invention. As shown in FIG. 5A, four adaptable VNA modules 510, 520, 530, 540 are connected in a chain.

VNA module 520 is configured a Master such that switch 521 is connected to the internal source. Both Port 1 and Port 2 of VNA module 520 are configured by switches 522 and 523 as outputs.

VNA module 510 is configured a Slave such that switch 511 is not connected to the internal source. Port 1 is configured as an input by switch 512 and Port 2 is configured as an output by switch 513.

VNA module 530 is configured a Slave such that switch 531 is not connected to the internal source. Port 1 is configured as an input by switch 532 and Port 2 is configured as an output by switch 533.

VNA module 540 is configured a Slave such that switch 541 is not connected to the internal source. Port 1 is configured as an input by switch 542 and Port 2 is configured as an output by switch 543.

Input Port 1 of VNA module 510 receives signal from output port 2 of VNA module 520. Input Port 1 of VNA module 530 receives signal from output port 1 of VNA module 520. Input Port 2 of VNA module 540 receives signal from output port 1 of VNA module 530.

As illustrated by FIG. 5A, VNA module 520 serves as a bidirectional master. Each slave receives the signal from the master on one port, monitors that signal, and repeats it on the other port for transmission to additional slave VNA modules (if present). Additional slave modules can be connected in similar fashion. However phase stability is improved as compared to the prior art embodiment of FIG. 3. Because the master is bidirectional, the number of chained modules on each side of the master, and hence the total phase drift in line amplifiers along the daisy chain is reduced. To put it another way, the phase drift can be reduced by up to half using a bidirectional master as compared to a single output port master VNA.

Figure 5B:
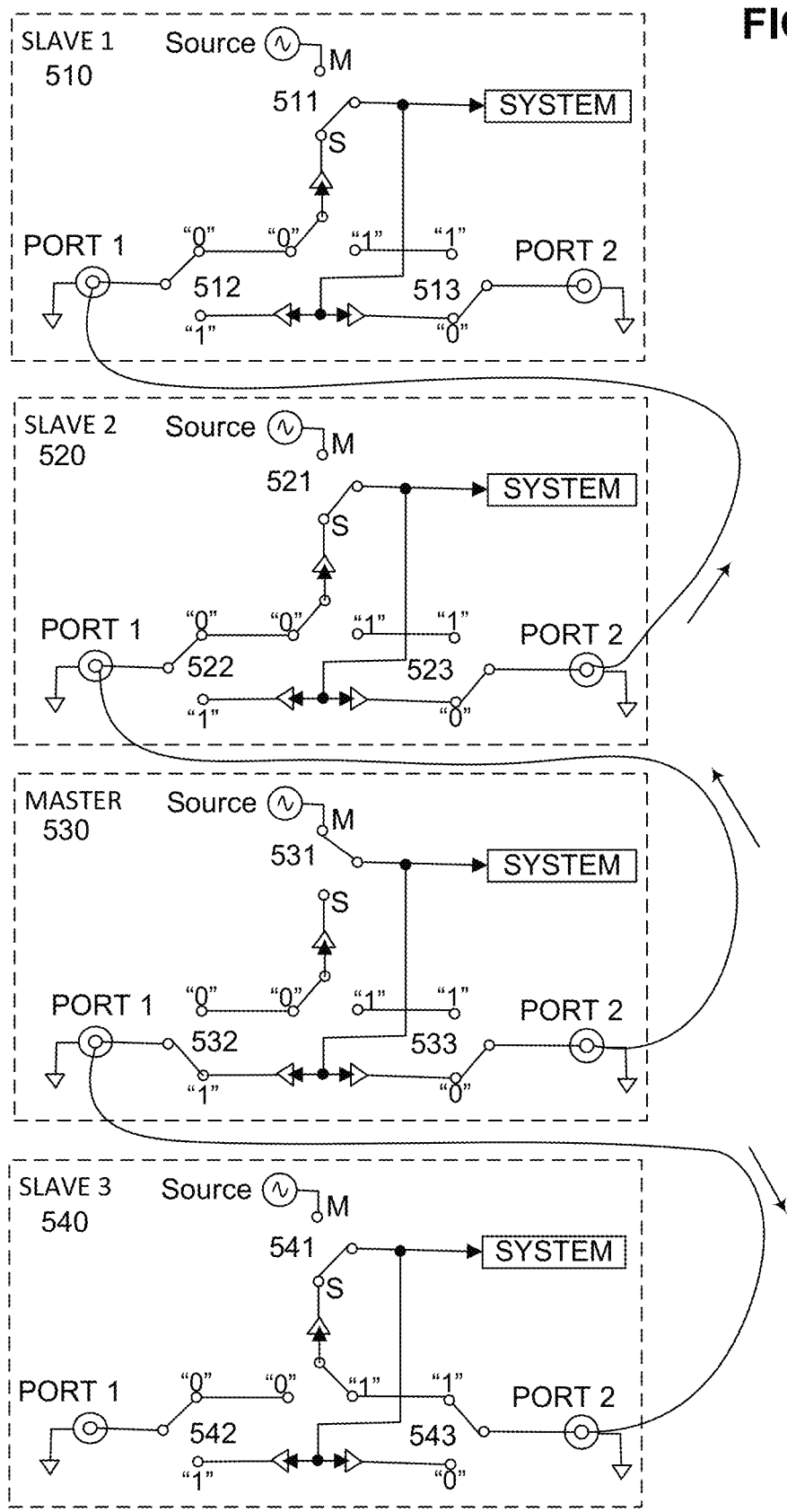

FIG. 5B illustrates how reconfiguration of the switches can reconfigure the function of the multiple adaptable VNA modules according without changing the cables. As shown in FIG. 5B. The configuration of the switches can be permed using DC offset signal applied to the ports themselves as shown in FIG. 4C, or via control signals provided over another interfaces as shown in FIG. 4A.

As shown, in FIG. 5B, VNA module 530 is configured a Master such that switch 531 is connected to the internal source. Both Port 1 and Port 2 of VNA module 530 are configured by switches 532 and 533 as outputs.

VNA module 510 is configured a Slave such that switch 511 is not connected to the internal source. Port 1 is configured as an input by switch 512 and Port 2 is configured as an output by switch 513.

VNA module 520 is configured a Slave such that switch 521 is not connected to the internal source. Port 1 is configured as an input by switch 522 and Port 2 is configured as an output by switch 523.

VNA module 540 is configured a Slave such that switch 541 is not connected to the internal source. Port 1 is configured as an input by switch 542 and Port 2 is configured as an output by switch 543.

Input Port 1 of VNA module 510 receives signal from output port 2 of VNA module 520. Input Port 1 of VNA module 520 receives signal from output port 1 of VNA module 530. Input Port 2 of VNA module 540 receives signal from output port 1 of VNA module 530.

This illustrates how the master/slave relationship of the VNA modules of FIGS. 5A and 5B can be reconfigured without re-cabling of the system.

Figure 6:
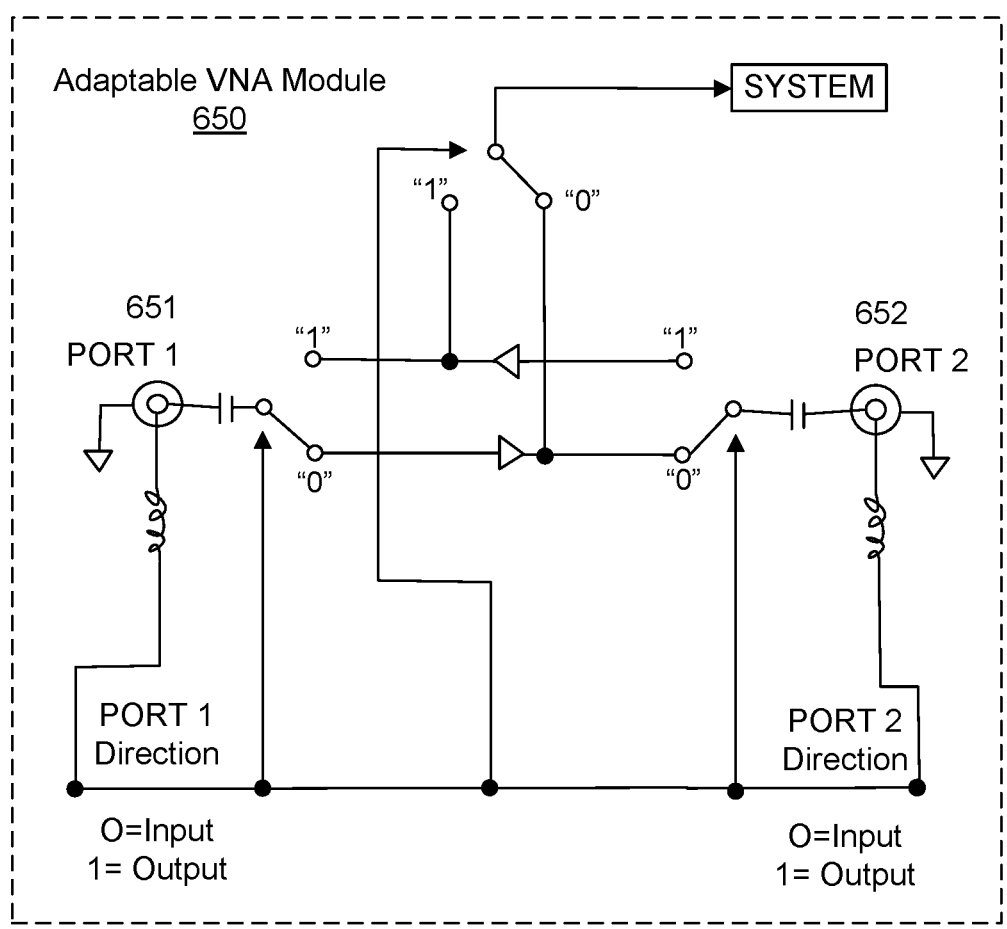
FIG. 6 illustrates aspects of a bidirectional slave VNA module according to an embodiment of the invention.

FIG. 6 illustrates aspects of a bidirectional slave VNA module according to an embodiment of the invention. As shown in FIG. 6, Adaptable VNA module 650 is similar to adaptable VNA module 450 of FIG. 4C. However, adaptable VNA module 650 has no internal RF source. Thus adaptable VNA module 650 can only serve as a slave VNA. The ports 651 and 652 are still configurable as input or output ports. Configuration is provided over the same line as is connected to ports 651, using the DC offset or other configuration signal or interface as previously described. The VNA module also has one or more test ports (not shown) for connecting the VNA to a device under test (DUT). For sake of clarity only the ports for distributing the RF signal and synchronizing the VNA modules are shown in the drawings.

Adaptable Long Range VNA Module And Star Hub

A master VNA module can be connected to multiple slave VNA modules by connecting the VNA modules in a daisy chain arrangement. A source in the single master VNA module is used to generate the frequency sweeping signal and this signal is passed from the master VNA module to one or more slave VNA modules. Prior techniques relied on the left end unit being the Master and all units to its right being Slaves. Connectors and cables between Master and Slave units dictate the physical setup. Moreover, prior connectors were electrically conductive wires in which signals could be dissipated or distorted over long distances. This is simple and efficient but lacks flexibility of placement and connection of modules.

As described above, adaptable VNA modules allow more flexible interconnection of master and slave modules. However, wired connections are still unsuitable for connecting VNA modules located at large distances from one another. Over large distances, signal dissipation and noise can interfere with RF signal transmission form the source of the master VNA module to the slave VNA modules. Accordingly, for long distances optical signals are preferred. The signal loss per meter of coaxial cable is 1 dB/m whereas the loss per meter of optical fiber is 0.003 dB/m. Thus, 1 km of fiber has the same signal loss as 3 m of coaxial cable. To put it another way, using optical fibers, the VNA modules in a daisy chain may be spaced 1 or more kilometers from each other and still be effective—this would not be possible with coaxial cable.

Figure 7A:
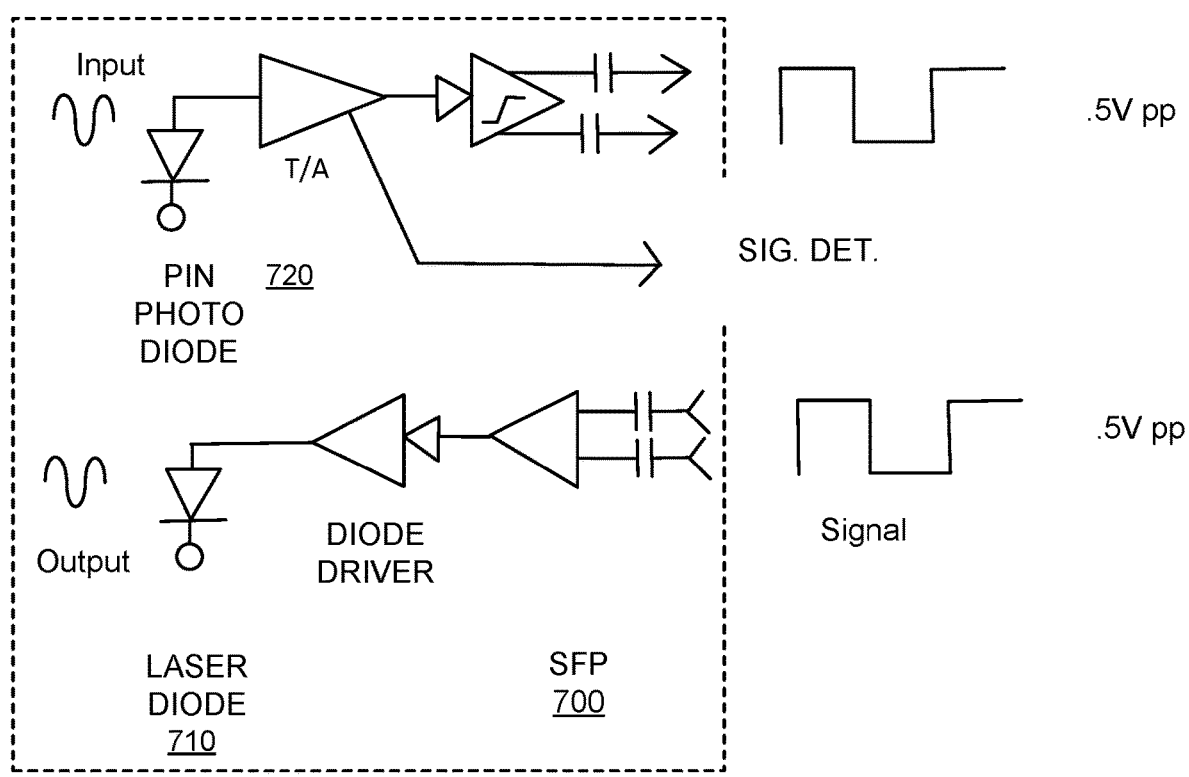
FIG. 7A illustrates an optical port for use in optical input/output port suitable for use in adaptable star hub and adaptable VNA modules according to and embodiment.

FIG. 7A illustrates an optical port for use in optical input/output port suitable for use in adaptable star hub and adaptable VNA modules according to an embodiment. The small form-factor pluggable (SFP) optical transceiver is a compact, hot-pluggable optical module transceiver used for both telecommunication and data communications applications. SFP modules are connected by fiber optic cable. The connections may be used to transfer high bandwidth signals which can be used to synchronize VNA modules over long distances (e.g. 300 m deepening on the fiber). The SFP modules support signals ranging from 11's of kHz to 10 GHz. This overcomes the limitations on VNA module placement imposed by wired/electrical connections where signal transmission over long distances is impossible or impracticable. SFP modules and fiber optic connections can be implemented in daisy chain arrangements of VNA modules and/or in star hub arrangements of VNA modules.

FIG. 7A is a block diagram of an SFP system in which optical signals are transmitted to the SFP over a fiber optic connection and received by pin photodiode 720. Photodiode 720 converts the optical signal into an RF/data signal which is then passed onto the device as in the same manner as a wired signal. Likewise output signals are sent to laser diode drive 710, which generates laser light which can be communicated out of the device along the optical fiber. Suitable SFP modules can be used as input/output ports of the adaptable star hubs and VNA modules previously discussed. It should be noted that the SFP can carry both an RF equivalent optical signal as well as a data signal. Thus the SFP can be used to transmit source signals from master to slave modules, directly or via a hub, and also to transmit data packets to configure the ports of the VNA modules or star hub.

The typical Microwave RF signal available at these connectors is converted to optical signals for transmission through Fiber rather than RF Coax to reduce cable loss and increase maximum separation distance between modules. Advantages of this approach include allowing any unit to be a Master and allowing distances between modules to be 100's of Meters without loss of synchronization. Features of an adaptable long range VNA module include: exceptionally long permissible length between VNA modules (100's of Meters); any VNA can be a Master; no re-cabling needed for reconfiguring Master selection; bidirectional Daisy Chain connectors (Signal pass upstream or Downstream); and Dual output Daisy Chain connectors (Master in the Middle).

Figure 7B:
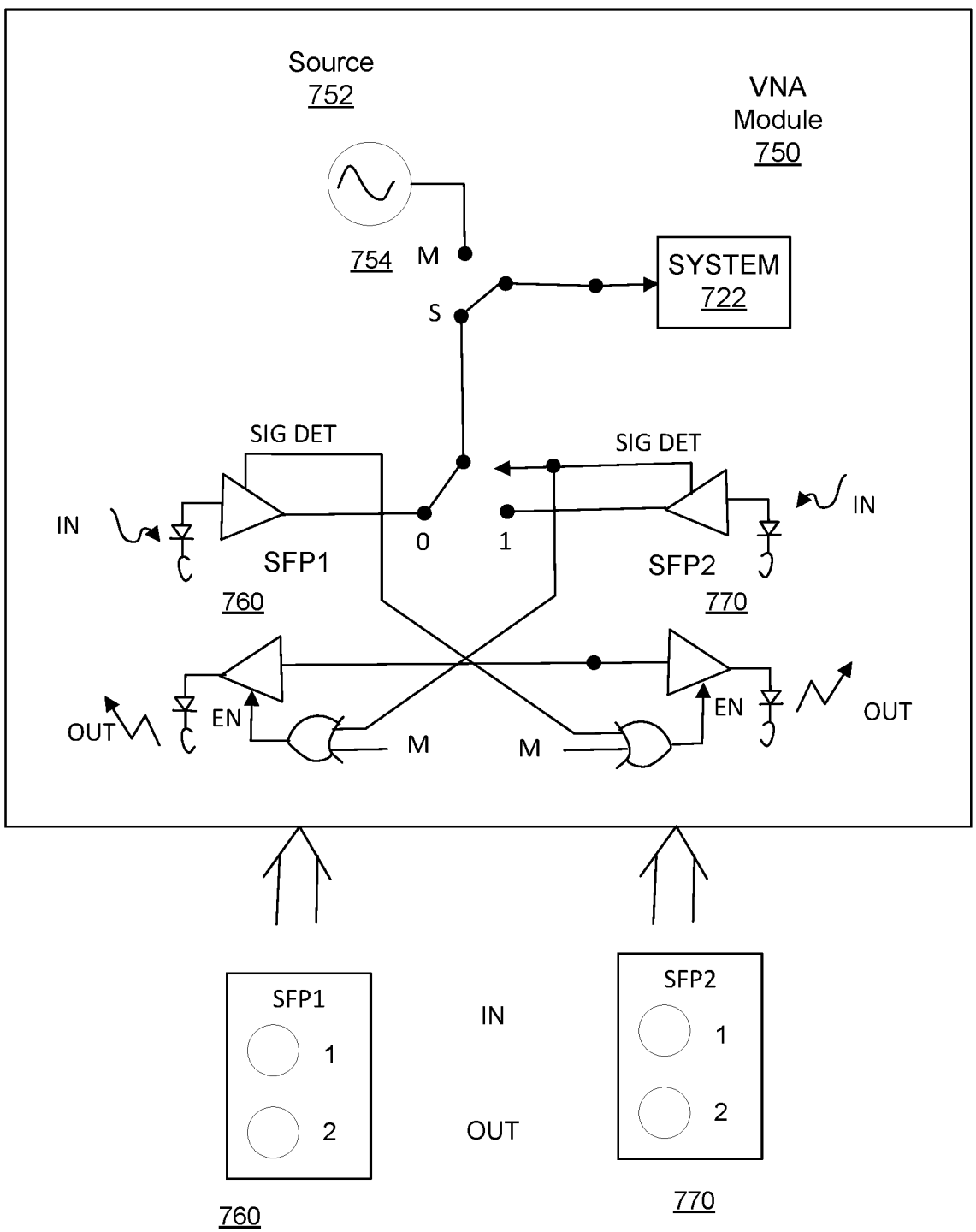
FIG. 7B shows a block diagram illustrating how optical transceiver modules can be integrated into an adaptable VNA module according to an embodiment.

FIG. 7B shows a block diagram illustrating how SFP optical transceiver modules can be integrated into an adaptable long range VNA module 750 according to an embodiment. VNA module 750 includes a source 752 and can thus be set up as master or slave depending upon configuration or switch 754. The SFP modules 760, 770 can each be configured as an output or an input. The SFP modules can be connected by optical fibers to another SFP modules of a VNA modules or a star hub in order to transfer synchronization signals and or configuration data. The VNA module also has one or more test ports (not shown) for connecting the VNA to a device under test (DUT). For sake of clarity only the ports for distributing the RF signal and synchronizing the VNA modules are shown in the drawings.

Advantages of the adaptable long range VNA module 750 include the following. Exceptionally long lengths are supported between modules (100's of meters). Any VNA can be configured as master (or slave). No reconnection of fibers is required for reconfiguring master selection. Bidirectional daisy chain connections can be implemented such that the signal can pass upstream or downstream through the chain. Dual output configurations of VNA modules enable master in the middle arrangements.

Figure 8A:
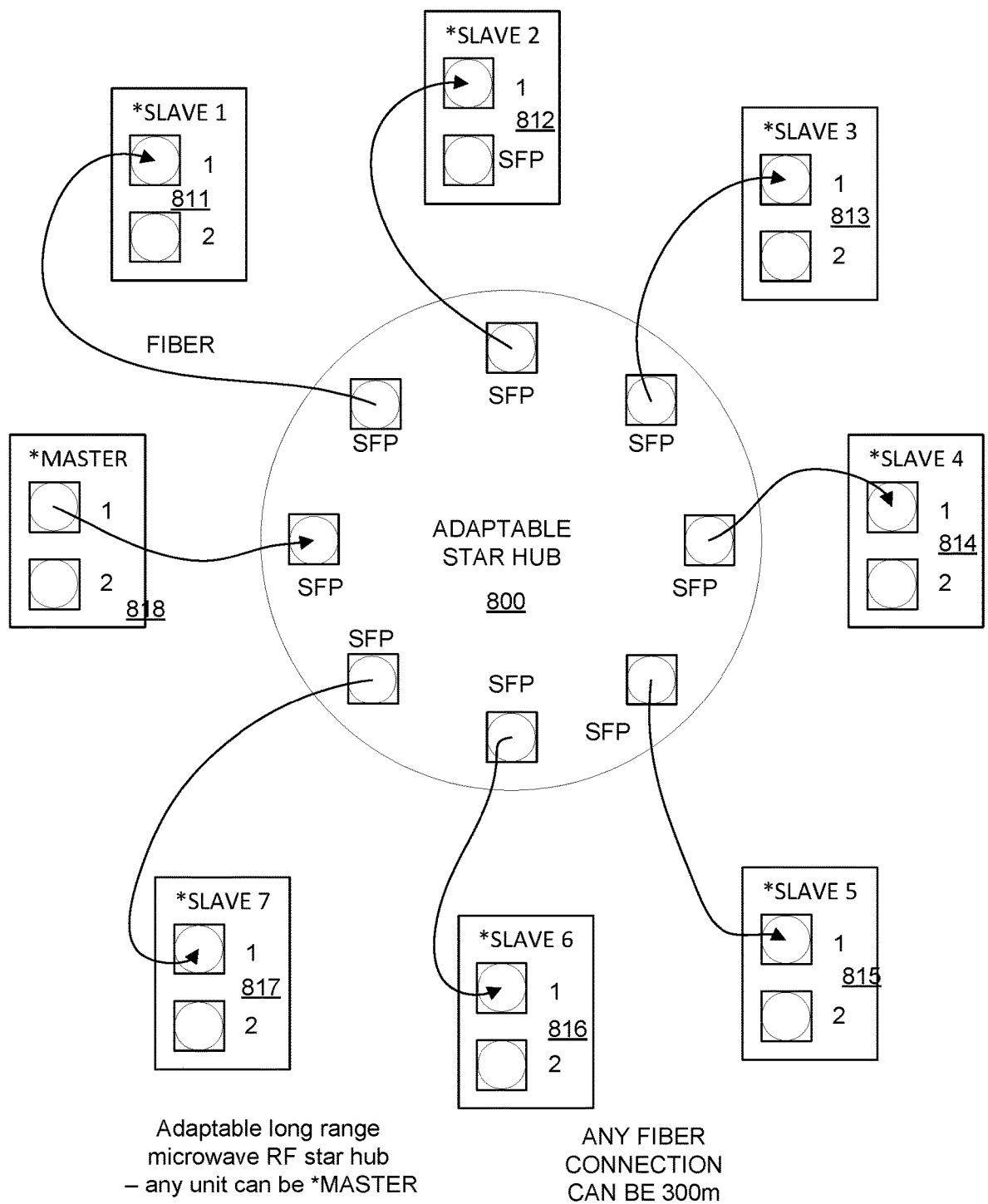
FIG. 8A illustrates a system comprising multiple adaptable VNA modules connected by an adaptable star hub using optical ports and connectors according to an embodiment.

FIG. 8A illustrates a system comprising multiple adaptable VNA modules connected by an adaptable star hub using optical ports and connectors according to an embodiment. FIG. 8A illustrates an arrangement in which adaptable long range VNA modules 811-818 are connected by an adaptable long range star hub 800. The adaptable long range VNA modules 811-818 and adaptable long range star hub 800 are provided with SFP modules at the inputs outputs.

Figure 8B:
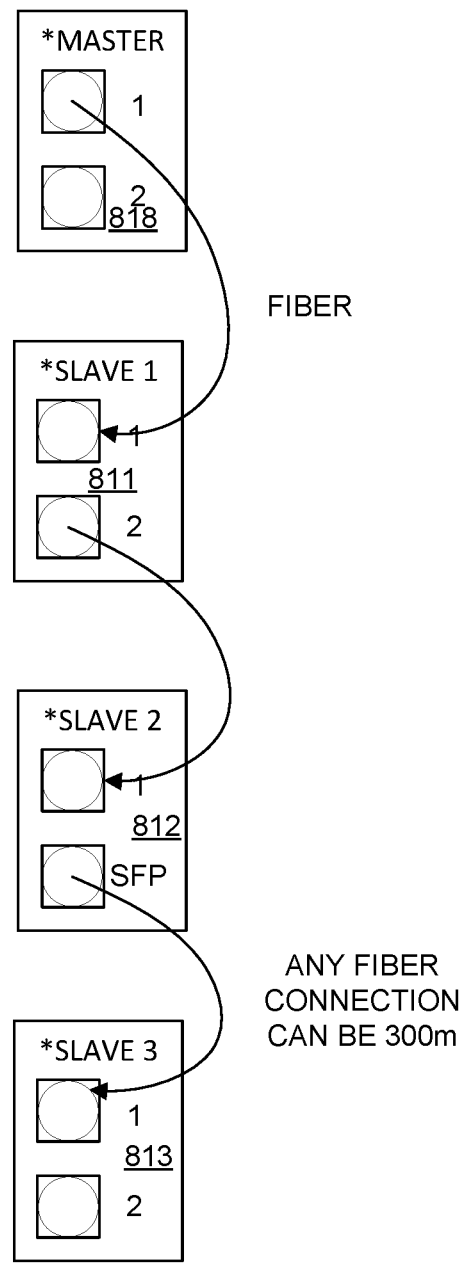
FIG. 8B illustrates a system comprising multiple adaptable VNA modules connected by optical fibers according to an embodiment.

The modules are connected by optical fibers instead of wires. The fiber connections can be up to 300 m without loss of signal/synchronization. Moreover as with the prior embodiments, the adaptable long range VNA modules 811-818 and the ports can be configured as master/slave input or output such that the system can be reconfigured with adjusting the fiber interconnections between the modules. Any module can be the master module. Any of the SFP ports can be used for input or output depending upon the configuration. As shown in FIG. 8B, the adaptable long range VNA modules can also be connected using a daisy chain arrangement without a hub.

FIG. 9 illustrates a block diagram of an adaptable long range microwave RF star hub according to an embodiment. FIG. 9 illustrates an adaptable star hub having optical ports according to and embodiment. This is similar to adaptable star hub 200 of FIG. 2B. However SFP optical modules comprising the photodiodes and laser diode drivers of FIG. 7 are used in place of electrical ports. RF signals (in optical form) can be received at any of the ports and distributed to any of the ports. The ports can be configured in any fashion such that any connected module/port can server as the source of the master signal. Furthermore, the data for configuring the star hub can also be received over the optical fiber at one of the ports (or via another mechanism previously described).

In some embodiments, the present invention includes a computer program product which is a storage medium or computer readable medium (media) having instructions stored thereon/in which can be used to program a computer to perform any of the processes of the present invention. The storage medium can include, but is not limited to, any type of disk including floppy disks, optical discs, DVD, CD-ROMs, microdrive, and magneto-optical disks, ROMs, RAMs, EPROMs, EEPROMs, DRAMs, VRAMs, flash memory devices, magnetic or optical cards, nanosystems (including molecular memory ICs), or any type of media or device suitable for storing instructions and/or data.

The previous description of the preferred embodiments is provided to enable any person skilled in the art to make or use the embodiments of the present invention. While the invention has been particularly shown and described with reference to preferred embodiments thereof, it will be understood by those skilled in the art that various changes in form and details may be made therein without departing from the spirit and scope of the invention. It is intended that the scope of the invention be defined by the following claims and their equivalents.

The invention claimed is:

1. An adaptable vector network analyzer (VNA) module comprising:
a radio-frequency (RF) source to generate a first RF signal;
a test port connectable to a device under test; and
a first port and a second port, wherein the adaptable VNA module is configurable in a plurality of configurations including:
a first configuration wherein one or both of the first port and the second port operate as an output to provide the first RF signal;
a second configuration wherein the first port operates as an input to receive a second RF signal and the second port operates as an output to provide the second RF signal such that the second RF signal is passed through the adaptable VNA module from the first port to the second port; and
a third configuration wherein the second port operates as an input to receive a third RF signal and the first port operates as an output to provide the third RF signal such that the third RF signal is passed through the adaptable VNA module from the second port to the first port.

2. The adaptable VNA module of claim 1 wherein:
when the adaptable VNA module is configured in the first configuration, the first RF signal is provided to the test port;
when the adaptable VNA module is configured in the second configuration, the second RF signal is provided to the test port; and
when the adaptable VNA module is configured in the third configuration, the third RF signal is provided to the test port.

3. The adaptable VNA module of claim 2, further comprising:
a data interface and configuration controller;
wherein the adaptable VNA module receives configuration data via the data interface; and
wherein, in response to the configuration data, the configuration controller configures the adaptable VNA module.

4. The adaptable VNA module of claim 2, further comprising:
a DC signal detector;
wherein the adaptable VNA module receives a DC signal on at least one of the first and second ports; and
wherein, in response to the DC signal, the adaptable VNA module is configured.

5. The adaptable VNA module of claim 2, wherein:
the first port is a first optical port and second port is a second optical port.

6. The adaptable VNA module of claim 5, further comprising:
a data interface and configuration controller;
wherein the adaptable VNA module receives optically encoded configuration data at the data interface from one of the first optical port and second optical port; and
wherein the configuration controller configures the adaptable VNA module in response to the optically encoded configuration data.

7. The adaptable VNA module of claim 2, wherein when the adaptable VNA module is configured in the first configuration, the adaptable VNA module is configurable such that the first RF signal from the RF source is provided to each of a plurality of additional VNA modules via only the first port.

8. The adaptable VNA module of claim 2, wherein when the adaptable VNA module is configured in the first configuration, the adaptable VNA module is configurable such that the first RF signal from the RF source is provided to each of a plurality of additional VNA modules via both the first port and second port.

9. The adaptable VNA module of claim 2, wherein when the adaptable VNA module is configured in the first configuration, the adaptable VNA module is configurable such that the first RF signal from the RF source is provided to each of a plurality of additional VNA modules via the first port and an adaptable star hub connector module with configurable ports.

10. The adaptable VNA module of claim 5, wherein when the adaptable VNA module is configured in the first configuration, the adaptable VNA module is configurable such that the optically encoded RF signal from the RF source is provided to each of a plurality of additional VNA modules via only the first optical port.

11. The adaptable VNA module of claim 5, wherein when the adaptable VNA module is configured in the first configuration, the adaptable VNA module is configurable such that the optically encoded RF signal from the RF source is provided to each of a plurality of additional VNA modules via both the first optical port and second optical port.

12. The adaptable VNA module of claim 5, wherein when the adaptable VNA module is configured in the first configuration, the adaptable VNA module is configurable such that the optically encoded RF signal from the RF source is provided to each of a plurality of additional VNA modules via the first optical port and an adaptable star hub connector module with configurable optical ports.

13. A network of adaptable vector network analyzer (VNA) modules comprising:
a first adaptable VNA module, where in the first adaptable VNA module is the adaptable VNA module of claim 2, and wherein the first adaptable VNA module is configured in the first configuration to provide the first RF signal at the first port;

a second adaptable VNA module comprising:
  an RF source to generate the second RF signal;
  a test port connectable to the device under test;
  wherein the second adaptable VNA module is configured in the second configuration and a first port operates as an input to receive the first RF signal from the first port of the first adaptable VNA module; and
  a second port operates as an output to provide the first RF signal; and
a third adaptable VNA module comprising:
  an RF source to generate the third RF signal;
  a test port connectable to the device under test;
  wherein the third adaptable VNA module is configured in the third configuration and a second port operates as an input to receive the first RF signal from the second port of the second adaptable VNA module; and
  a first port operates as an output to provide the first RF signal.

14. The network of adaptable VNA modules of claim 13 wherein for each of the first, second, and third adaptable VNA modules, the first port and the second port are optical ports.

15. The network of adaptable VNA modules of claim 13 wherein the first adaptable VNA module comprises an interface for configuring the adaptable VNA module.

16. A network of adaptable vector network analyzer (VNA) modules comprising:
a first adaptable VNA module, where in the first adaptable VNA module is the adaptable VNA module of claim 2;
a second adaptable VNA module comprising:
  an RF source to generate the second RF signal;
  a test port connectable to the device under test; and
  a first port and a second port, wherein the adaptable VNA module is configurable in a plurality of configurations including:
    a first configuration wherein one or both of the first port and the second port operate as an output to provide the first RF signal;
    a second configuration wherein the first port operates as an input to receive a second RF signal and the second port operates as an output to provide the second RF signal such that the second RF signal is passed through the adaptable VNA module from the first port to the second port; and
    a third configuration wherein the second port operates as an input to receive a third RF signal and the first port operates as an output to provide the third RF signal such that the third RF signal is passed through the adaptable VNA module from the second port to the first port; and
an adaptable star hub comprising:
  a first port coupled to the first port of the first adaptable VNA module; and
  a second port coupled to the first port of the second adaptable VNA module,
  wherein the adaptable star hub is configurable such that:
    the first port operates as an input to receive the first RF signal from the first port of the first adaptable VNA module and the second port operates as an output to provide the first RF signal to the first port of the second adaptable VNA module; or
    the second port operates as an input to receive the second RF signal from the first port of the second adaptable VNA module and the first port operates as an output to provide the second RF signal to the first port of the first adaptable VNA module.

17. The network of adaptable VNA modules of claim 16 wherein the adaptable star hub comprises:
  a first switch to couple the first port to either a first output termination resistor or an input termination resistor; and
  a second switch to couple the second port to either a second output termination resistor or the input termination resistor.

18. The network of adaptable VNA modules of claim 16 wherein for each of the first and second adaptable VNA modules and the adaptable star hub, the first port and the second port are optical ports.

19. The network of adaptable VNA modules of claim 16 wherein when the first adaptable VNA module is configured in the first configuration and provides the first RF signal at the first port, the second adaptable VNA module is configured in the second configuration and receives the first RF signal at the first port.

20. The network of adaptable VNA modules of claim 16 wherein the first adaptable VNA module comprises an interface for configuring the first adaptable VNA module.

21. The adaptable VNA module of claim 1 comprising:
  a first switch to selectively couple the test port to one of an input node or the RF source, the test port further coupled to an output node, where the input node and output node are nodes internal to the adaptable VNA module;
  a second switch to selectively couple the first port to one of a first internal node or a second internal node;
  a third switch to selectively couple the second port to one of a third internal node or a fourth internal node;
  a fourth switch to selectively couple a fifth internal node to one of the first internal node or the third internal node;
  a first buffer having an input coupled to the fifth internal node and an output coupled to the input node;
  a second buffer having an input coupled to the output node and an output coupled to the second internal node; and
  a third buffer having an input coupled to the output node and an output coupled to the fourth internal node.

* * * * *